United States Patent [19]

Susuki

[11] Patent Number: 5,390,144
[45] Date of Patent: Feb. 14, 1995

[54] SEMICONDUCTOR MEMORY

[75] Inventor: Toshihiko Susuki, Ooita, Japan

[73] Assignee: Kabushiki Kaisha Toshiba, Kawasaki, Japan

[21] Appl. No.: 203,398

[22] Filed: Mar. 1, 1994

[30] Foreign Application Priority Data

Mar. 2, 1993 [JP] Japan .................................. 5-041467

[51] Int. Cl.$^6$ ............................................. G11C 11/40
[52] U.S. Cl. ...................................... 365/149; 365/82; 257/317
[58] Field of Search ...................... 365/149, 182, 185; 257/213, 244, 314, 316, 317

[56] References Cited

U.S. PATENT DOCUMENTS 4,812,898  3/1989  Sumihiro .............................. 365/182

Primary Examiner—Terrell W. Fears
Attorney, Agent, or Firm—Finnegan, Henderson Farabow, Garrett & Dunner

[57] ABSTRACT

A p-type pillared layer, made of a silicon single crystal, is formed on a bit line formed of an n-type diffusion layer by expitaxial growth. An FET, in which a gate electrode is provided through an insulating film and a side surface of the pillared layer is served as a channel area, is formed around the pillared layer. Also, a lower electrode, formed of an n-type silicon layer contacting an upper portion of the pillared layer, an insulating film, and an upper electrode are sequentially provided to surround the FET, thereby constituting a capacitor. The receptive elements are overlaid on each other in a vertical direction, so that a processing margin becomes zero and the wire connecting the respective elements is omitted, and a degree of integration of a semiconductor memory can be improved.

9 Claims, 6 Drawing Sheets

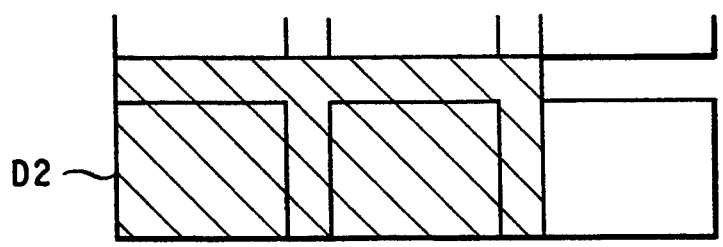
F I G. 6B

SEMICONDUCTOR MEMORY

BACKGROUND OF THE INVENTION

1. Field of the Invention

The present invention relates to a semiconductor memory and, more particularly to a DRAM (dynamic random access memory).

2. Description of the Related Art

As shown in FIGS. 5A and 5B, in the conventional general DRAM, a pair of cells, which are formed of a selection transistor T and a capacitor C, is symmetrically provided to sandwich a contact portion N of a bit line BL. Each transistor T is formed to have a MOSFET structure. Also, each transistor T has an insulating film 12 formed on a semiconductor substrate 10 and a gate electrode 14. The gate electrode 14 is formed as a part of a word line WL of each cell.

A diffusion layers 16 and 18, serving as source/drain regions of the transistor T, are formed on the substrate. The diffusion layer 16 or a part thereof contacts the bit line BL. The diffusion layer 18 or a part thereof functions as a lower electrode of the capacitor C. The capacitor C comprises the part of the diffusion layer 18, an insulating film 22 formed on the layer 18, and an upper electrode 24. In the figure, reference numeral 26 denotes an insulating film for an element separation.

In the above-mentioned DRAM structure, the respective elements such as the capacitor C, transistor T, contact portion N of the bit line BL are horizontally arranged to be independent of each other, and a fixed area is occupied by the respective elements. Also, since a certain processing margin is needed between the respective elements, the occupied area, which is necessary for each element, is further increased. Therefore, in order to attain a high degree of integration, each element must be greatly miniaturized. Also, it is necessary to limit the processing margin as much as possible. Due to this, the processing technique becomes very difficult, and the yield is considerably limited.

SUMMARY OF THE INVENTION

In consideration of the above-mentioned problems, the present invention has been made. An object of the present invention lies in the points that receptive elements are overlaid on each other in a vertical direction, so that a processing margin becomes zero and the wiring among the respective elements is decreased, and a degree of integration of a semiconductor memory can be improved.

In the semiconductor memory cell for attaining the above object, a bit line made of a semiconductor layer of a first conductivity type is formed on a semiconductor substrate by expitaxial growth. A pillared layer made of a semiconductor layer of a second conductivity type is formed on the bit line. A gate electrode is provided through an insulating film around a side surface of the pillared layer, whereby an FET using the side surface of the pillared layer as a channel area is formed. Also, a lower electrode formed of the semiconductor layer of a first conductivity type contacting an upper portion of the pillared layer, an insulating film formed on the lower electrode, and an upper electrode formed on the insulating film are sequentially provided to surround the FET, thereby constituting a capacitor. According to the present invention, a transistor of a vertical type is formed on the bit line provided on the substrate, and the capacitor is formed thereon, so that a processing margin and the wiring among the elements can be deleted.

According to the first aspect of the present invention, there is provided a semiconductor memory cell comprising: a semiconductor substrate; a bit line, made of a semiconductor layer of a first conductivity type, formed on the semiconductor substrate, a pillared layer, made of a semiconductor layer of a second conductivity type, formed on the bit line to be projected upward; a gate insulating film formed around the pillared layer; a gate electrode formed around the gate insulating film, the gate electrode connected to a word line; a separation insulating film formed so as to expose an upper portion of the pillared layer, and cover the gate electrode; a lower electrode, made of a semiconductor layer of the first conductivity type, formed on an upper portion of the pillared layer and the separation insulating film; a capacitor insulating film formed on the lower electrode; and an upper electrode formed on the capacitor insulating film to be opposite to the lower electrode, wherein a FET including the gate electrode is provided between a portion of the bit line and a portion of the lower electrode opposite to each other through the pillared layer, and a capacitor is formed of the upper and lower electrodes and the capacitor insulating film.

According to the second aspect of the present invention, there is provided a method of manufacturing a semiconductor memory cell comprising the steps of: diffusing an impurity material to a surface of a semiconductor substrate to form a bit line made of a semiconductor layer of a first conductivity type; covering the entire surface of the substrate with an insulating film; selectively etching a part of the insulating film to expose a part of the line; selectively growing a semiconductor crystal on the exposed portion of the bit line to form a pillared layer made of a second conductivity type; covering the pillared layer with a gate insulating film; forming a conductive layer on the entire surface of an obtained structure; patterning the conductive layer to form a gate electrode covering the gate insulating film and a word line integrally connected to the gate electrode; forming an upper separation insulating film on the conductive layer; forming a hole in the gate insulating film, gate electrode and upper separation insulating film by etching such that the upper portion of the pillared layer is exposed; covering a side wall of the hole by a side separation insulating film; forming a lower electrode, made of the semiconductor layer of the first conductivity type, on the upper portion of the 10 pillared layer, and the upper and side separation insulating films; forming a capacitor insulating film on the lower electrode; and forming an upper electrode on the capacitor insulating film to be opposite to the lower electrode, wherein a FET including the gate electrode is provided between a portion of the bit line and a portion of the lower electrode opposite to each other through the pillared layer, and a capacitor is formed of the upper and lower electrodes and the capacitor insulating film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 6A and 6B are plane views each showing a conventional structure and the structure of the present invention so as to make comparison between the prior art and the present invention.

Figure 1:
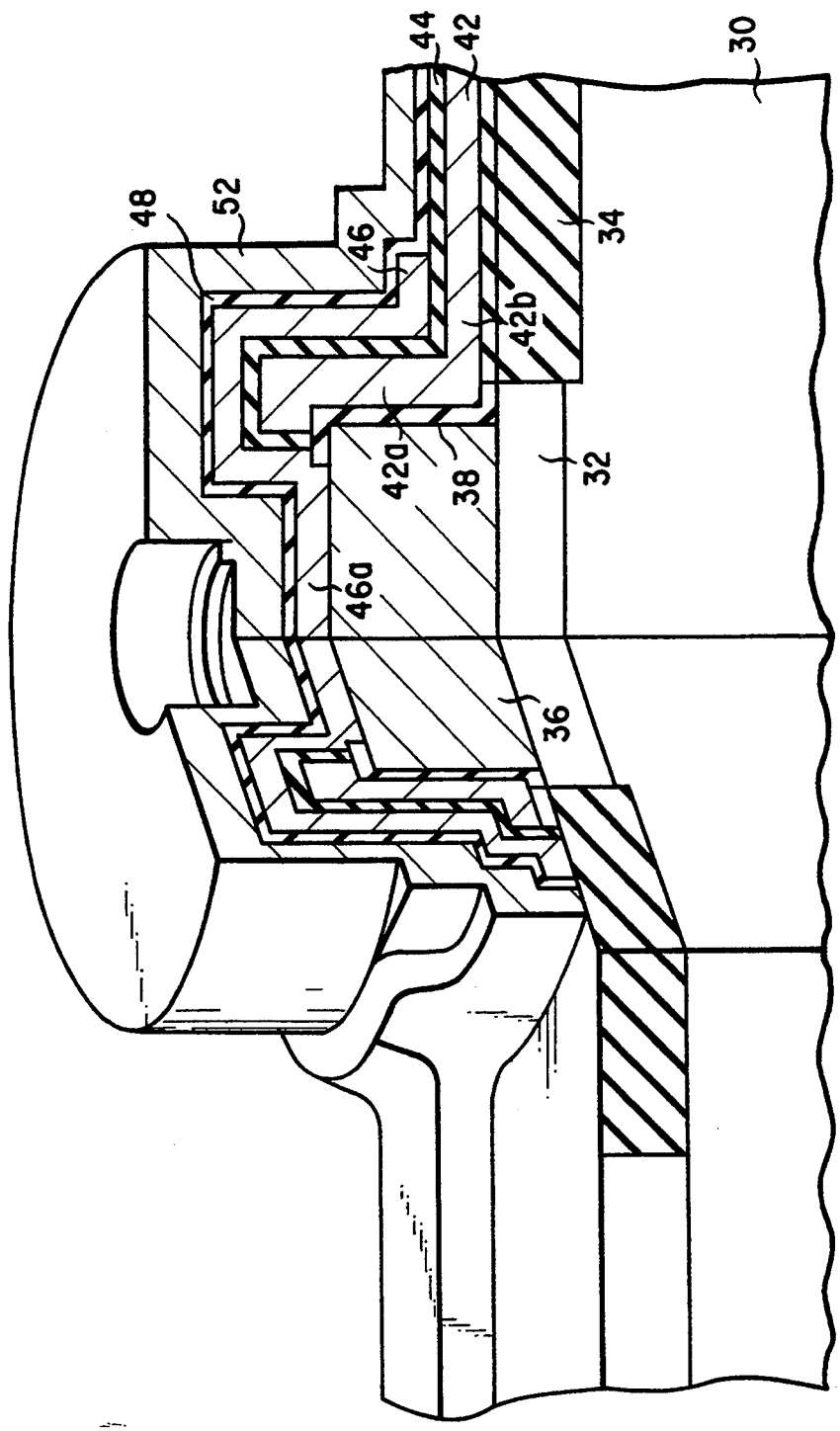
FIG. 1 is a perspective view of a partial cross section showing one cell of a DRAM according to an embodiment of the present invention.

DETAILED DESCRIPTION OF THE PREFERRED EMBODIMENT with reference to FIG. 1, one cell of a DRAM according to an embodiment of the present invention is shown.

In this embodiment, each of bit lines comprises a diffusion layer 32 of n-type, which is formed by diffusing an impurity material such as (arsenic) into a silicon substrate 30. The respective bit lines are insulated from each other by an oxide insulating film 34 for a cell separation.

On the diffusion layer 32, a pillared layer 36 made of a semiconductor single crystal such as a silicon single crystal, is selectively epitaxial-grown. The side of the pillared layer 36 functions as a channel area of a selection transistor of a DRAM cell. Due to this, an impurity material, e.g., B (boron) is added to the layer 36 when growing, so as to make the layer 36 of p-type. The amount of addition of the impurity material is adjusted so as to control a threshold voltage of the transistor.

An insulating film 38, which is formed by oxidation, is formed around the side surface of the pillared layer 36, and an n-type polysilicon film 42 doped with P (phosphorus) is formed to surround the insulating film 38. A portion 42a of the polysilicon layer 42 is located to be opposite to the pillared layer 36 through the insulating film 38, and functions as a gate electrode.

An n-type polysilicon film 46 doped with P (phosphorus) is formed to surround the polysilicon film 42 through an insulating film 44. The polysilicon film 46 comprises a central portion 46a, which directly contacts the top portion of the pillared layer 36. Therefore, in a portion between the diffusion layer 32 and the central portion 46a of the polysilicon film 46 through the pillared layer 36, there is formed an n-channel FET in which the portions 32 and 46a are used as source and drain regions, and the portion 42a of the polysilicon film 42 as a gate electrode.

The polysilicon film 42 has a portion 42b extending onto the insulating film 34. The polysilicon film 42 is formed to be a predetermined pattern as a word line.

An insulating film 48 is formed to surround the polysilicon film 46. The insulating film 48 is formed of, for example, a composite film formed of silicon nitride and silicon oxide films. Further, an n-type polysilicon film 52 doped with P (phosphorus) is formed to surround the insulating film 48. A capacitor of the DRAM cell is formed of the insulating film 48, and polysilicon films 46 and 52, which are opposite to each other to sandwich the insulating film 48 therebetween.

The following will explain the manufacturing process of the DRAM with reference to FIGS. 2 to 4.

Figure 2A:
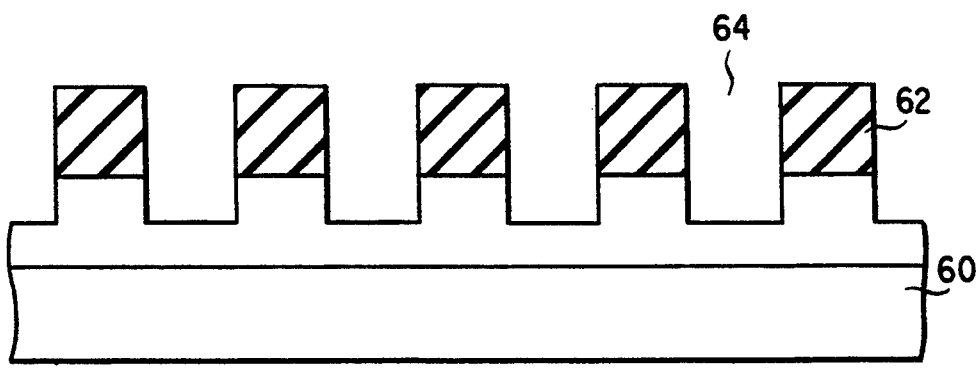
FIGS. 2A to 2C are cross sectional views showing the manufacturing steps of the DRAM according to the embodiment of the present invention in order.

First, a silicon oxide film 62, which is patterned to have a large number of rectangular through holes, is formed on a silicon substrate 60. Then, the silicon oxide film 62 is used as a mask to lightly etch the substrate 60, so that a large number of rectangular grooves 64 are formed (FIG. 2A).

Figure 2B:
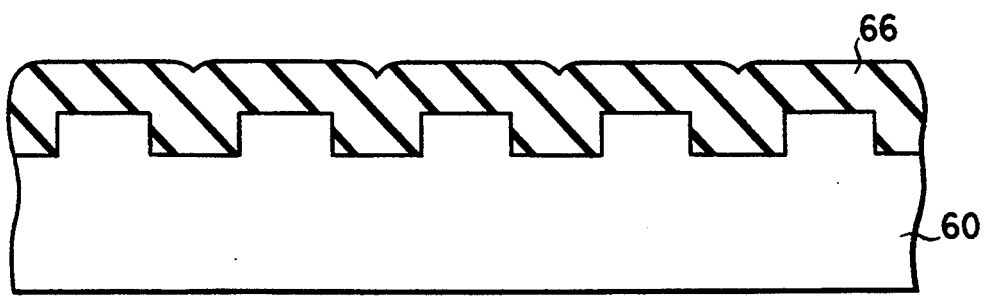
Figure 2C:
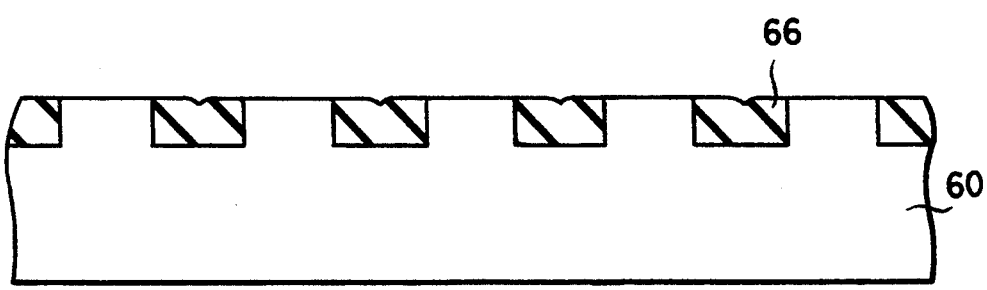

After removing the oxide film 62, an oxide film 66 is deposited on the entire surface of the substrate by low pressure chemical vapor deposition (LPCVD). Then, the entire surface is etched back, thereby the oxide film 66 is left in only each groove 64 (FIGS. 2B and 2C).

Figure 3A:
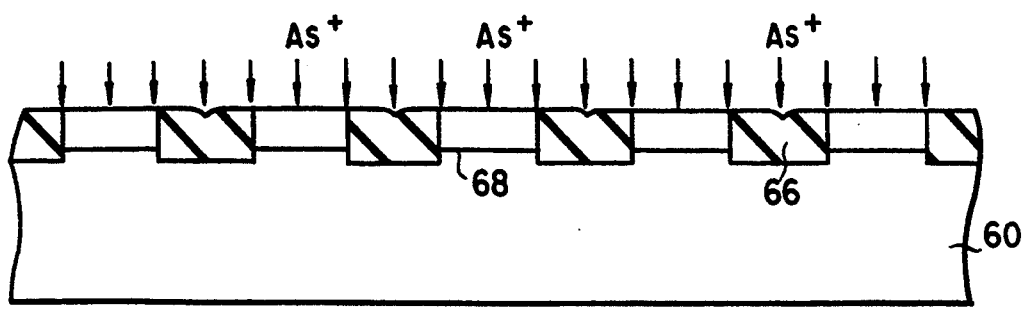
FIGS. 3A to 3C are cross sectional views showing the manufacturing steps of the DRAM following the step of FIG. 2C in order.

Thereafter, As ions are implanted into the entire surface of the substrate, so that an n-type diffusion layer 68 is formed on each of surface portions where the silicon substrate 60 is exposed (FIG. 3A). Each diffusion layer 68 corresponds to the diffusion layer 32 of the structure shown in FIG. 1. In other words, the diffusion layer 68 can be used as a bit wire. The insulation between the bit lines can be attained by the oxide film 68 previously formed.

Figure 3B:
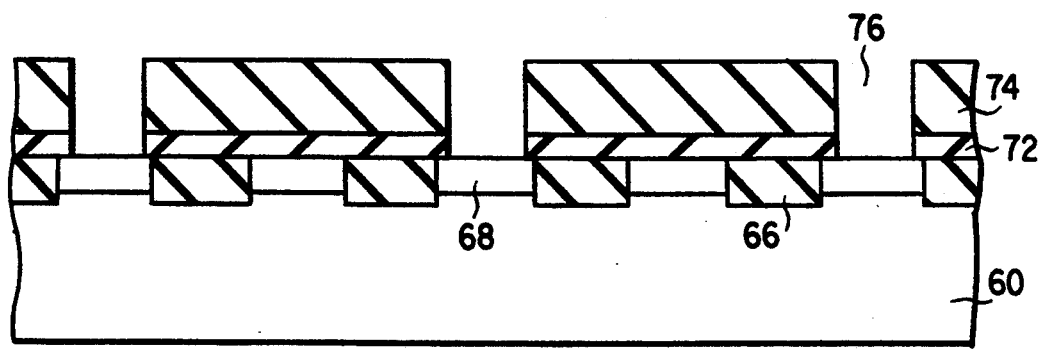

Next, a step of forming a selection transistor is performed. First, a silicon nitride film 72 is deposited on the entire surface of the substrate by LPCVD so as to protect the diffusion layer 68. Sequentially, a silicon oxide film 74 is deposited thereon by LPCVD such that the total thickness of the films 72 and 74 corresponds to a predetermined channel length of the selection transistor. Then, grooves 76 are formed in the silicon nitride film 72 and silicon oxide film 74 by photolithography and anisotropic ion etching (FIG. 3B).

Figure 3C:
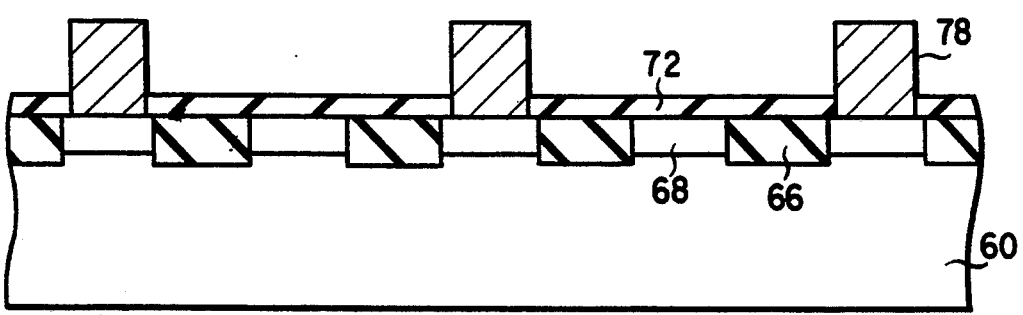

Then, a silicon single crystal is selectively epitaxial-grown on only the grooves 76. In this case, in order to control a threshold voltage of the transistor, an impurity material such as B (boron) is appropriately added thereto. Further, only the oxide film 74 is selectively removed by wet-etching, thereby completing a P-type pillared layer 78 for providing a channel area of a vertical transistor (FIG. 3C).

Figure 4A:
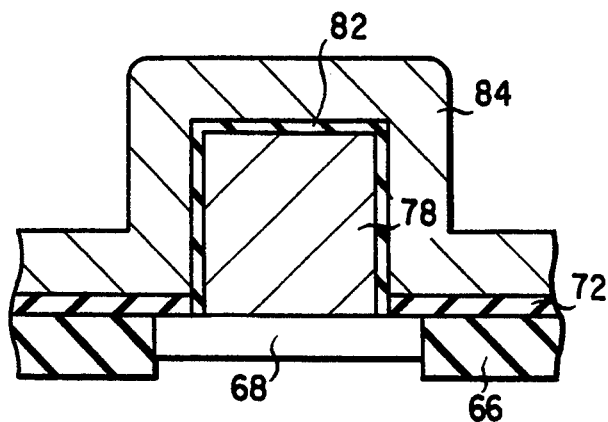
FIGS. 4A to 4C are cross sectional views showing the manufacturing steps of the DRAM following the step of FIG. 3C in order.
Figure 4B:
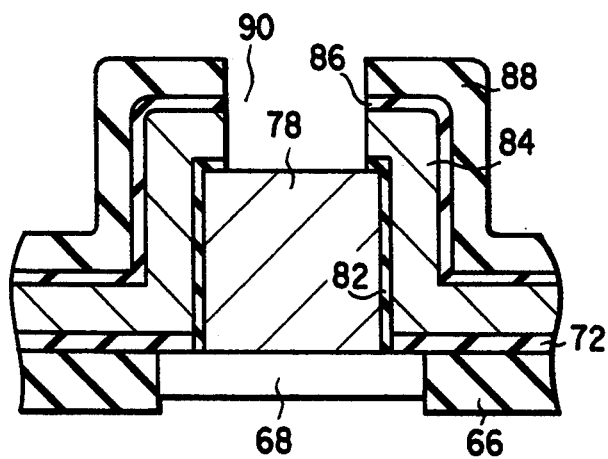
Figure 4C:
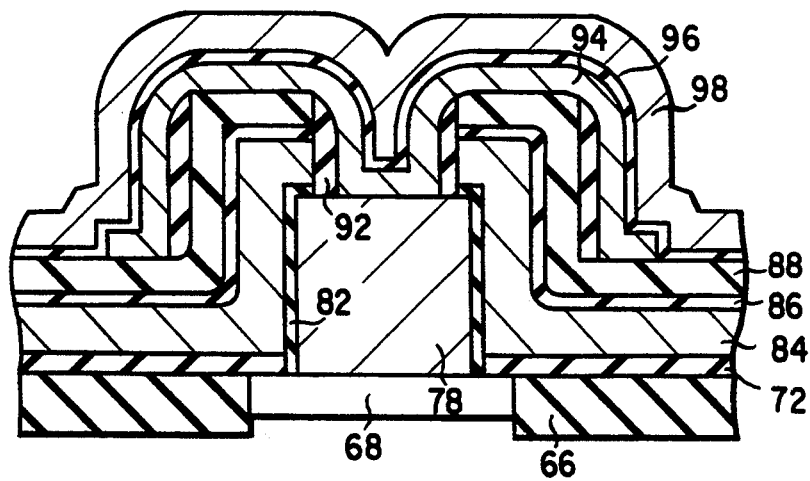
Figure 5A:
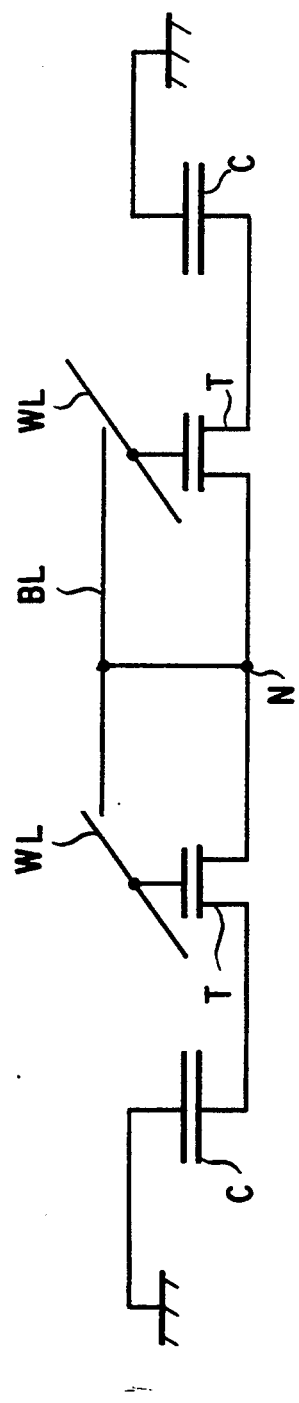
FIGS. 5A and 5B are a circuit diagram and a cross sectional view each showing a conventional general DRAM.
Figure 5B:
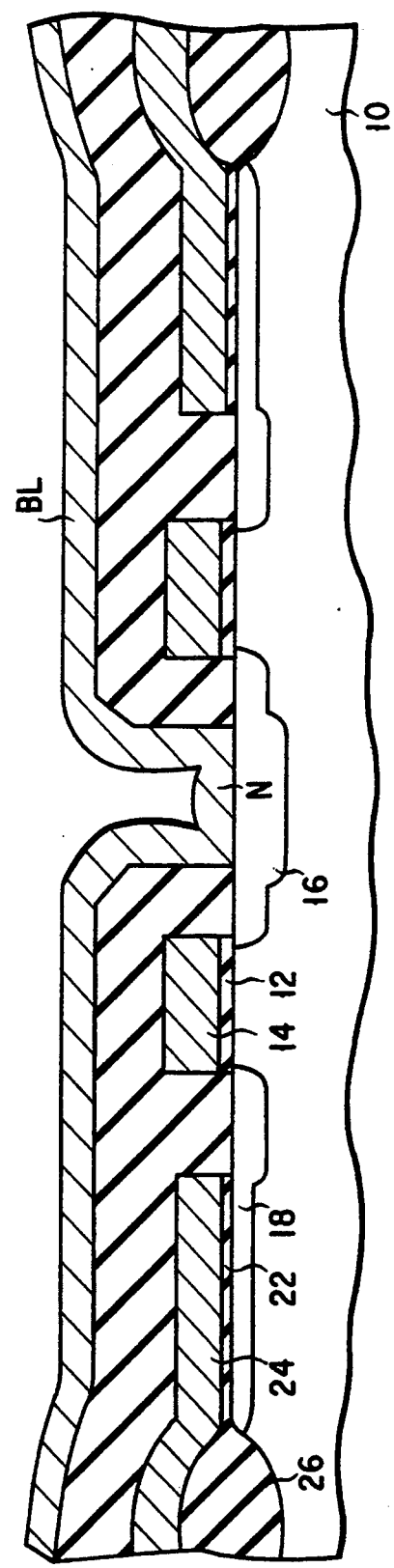

In FIGS. 4A to 4C showing the following steps, only one pillared layer 78 is shown.

After completing the pillared layer 78, a silicon oxide film 82, serving as a gate insulating film, is formed on the surface of the pillared layer 78 by oxidation. Next, a polysilicon film 84, serving as a gate electrode and a word line, is deposited on the entire surface of the substrate by LPCVD. In growing the polysilicon film 84, P (phosphorus) is added thereto, so that the film 84 of n-type is provided. Then, a part of the polysilicon film 84 is patterned to form word lines having a predetermined pattern by photolithography and anisotropic ion etching (FIG. 4A).

Next, a capacitor is formed. First, a thick silicon oxide film 86 is deposited on the polysilicon film 84 by lightly oxidizing. Then, a silicon oxide film 88 is deposited on the entire surface by LPCVD so as to ensure the insulation of the word line. Then, a hole 90 is formed in the films 82, 84, 86, and 88 by photolithography and anisotropic ion etching, and the top portion of the pillared layer 78 is exposed (FIG. 4B).

Next, a silicon oxide film 92 is deposited on the entire surface by CVD. Then, only a side wall portion thereof is left by anisotropic etching (FIG. 3B). Thereafter, a polysilicon film 94, serving as a capacitor lower electrode, is deposited on the entire surface by LPCVD. In growing the polysilicon film 94, P (phosphorus) is added thereto, so that the film 94 of n-type is provided. Then, by photolithography and anisotropic ion etching, the polysilicon film 94 is processed to have a predetermined pattern such that the respective cells are independently separated from each other.

Next, a capacitor insulating film 96 is formed on the entire surface of the substrate by, for example, a composite film formed of silicon nitride and silicon oxide films which are deposited by CVD. Then, a polysilicon film 98, serving as a capacitor upper electrode, is deposited on the entire surface thereof by LPCVD. In growing the polysilicon film 98, P (phosphorus) is added thereto, so that the film 98 of n-type is provided. Then, the polysilicon film 98 is processed to have a predetermined pattern such that the respective cells are independently separated from each other.

By the above-mentioned process, the DRAM according the embodiment of the present invention is completed. In FIG. 1, the structure of the DRAM was schematically shown in the form that the several layers were put together in order to effectively explain the function of each portion of the structure. Due to this, as compared with the structure shown in FIG. 1, in the structure of the DRAM formed by the processes shown in FIGS. 2 to 4, the number of the layers is larger, and the details of the structure are slightly different from the structure of FIG. 1. However, it is obvious that the structure of the DRAM formed by the process shown in FIGS. 2 to 4 is substantially the same as that of FIG. 1.

Figure 6A:
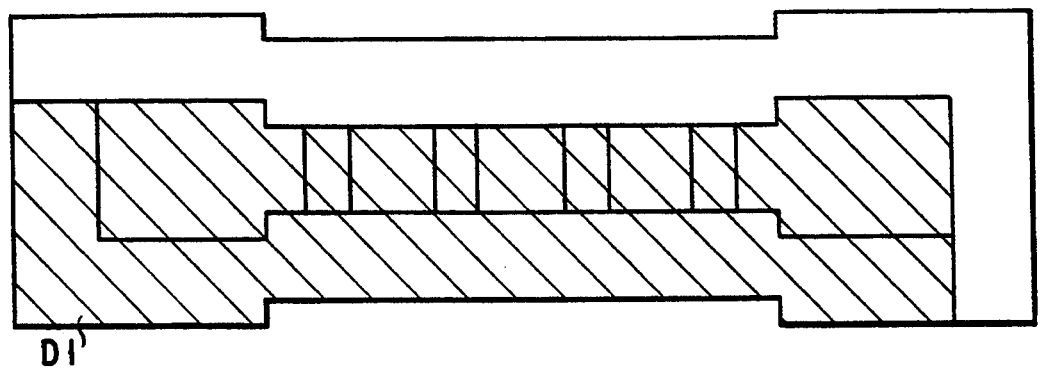

FIGS. 6A and 6B show the technical advantage of the present invention based on the comparison between the structure of the present invention and that of the conventional structure.

FIG. 6A shows a conventional structure D1, and FIG. 6B shows a structure D2 of the present invention. In each plane view of FIGS. 6A and 6B, a portion to be occupied by two cells is shown by hatching. As shown in the figures, two memory cells according to the present invention occupy an area for one conventional capacitor in the plan view. Moreover, there is no need of an area in the plan view, which is required for the bit line to contact the transistor. In other words, the area of the memory cell according to the present invention can be reduced to be about a half of that of the conventional one in the plan view.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory cell comprising:
   a semiconductor substrate;
   a bit line, made of a semiconductor layer of a first conductivity type, formed on said semiconductor substrate;
   a pillared layer, made of a semiconductor layer of a second conductivity type, formed on said bit line to be projected upward;
   a gate insulating film formed around said pillared layer;
   a gate electrode formed around said gate insulating film, said gate electrode connected to a word line;
   a separation insulating film formed so as to expose an upper portion of said pillared layer, and cover said gate electrode;
   a lower electrode, made of a semiconductor layer of the first conductivity type, formed on an upper portion of said pillared layer and said separation insulating film;
   a capacitor insulating film formed on said lower electrode; and
   an upper electrode formed on said capacitor insulating film to be opposite to said lower electrode,
   wherein a FET including said gate electrode is provided between a portion of said bit line and a portion of said lower electrode opposite to each other through said pillared layer, and a capacitor is formed of said upper and lower electrodes and said capacitor insulating film.

2. The cell according to claim 1, wherein a side portion of said bit line is surrounded by a cell separation insulating film formed on said substrate.

3. The cell according to claim 1, wherein said gate electrode and said word line are integrally formed to provide a conductive film.

4. The cell according to claim 1, wherein the side surface of said pillared layer is substantially perpendicularly formed.

5. The cell according to claim 1, wherein said capacitor insulating film and upper electrode are formed to cover substantially the entire of said lower electrode.

6. The cell according to claim 1, wherein said semiconductor layer constituting said bit line comprises a diffusion layer formed by diffusing an impurity material into said substrate.

7. The cell according to claim 1, wherein said semiconductor layer constituting said pillared layer comprises a single crystal layer formed by epitaxial growth.

8. The cell according to claim 1, wherein each of said gate electrode and said upper and lower electrodes comprises a semiconductor film formed by low pressure chemical vapor deposition such that an impurity material is added thereto.

9. The cell according to claim 1, wherein said first and second conductivity types are n-type and p-type, respectively.

* * * * *